(12) United States Patent
Hoang et al.

(10) Patent No.: US 10,840,468 B2
(45) Date of Patent: *Nov. 17, 2020

(54) ORGANIC EL ELEMENT AND METHOD FOR MANUFACTURING ORGANIC EL ELEMENT

(71) Applicant: JOLED INC., Tokyo (JP)

(72) Inventors: Minh Hiep Hoang, Kanagawa (JP); Noriyuki Matsusue, Tokyo (JP); Masaki Nishimura, Tokyo (JP); Kazuhiro Yoneda, Tokyo (JP)

(73) Assignee: JOLED INC., Tokyo (JP)

( * ) Notice: Subject to any disclaimer, the term of this patent is extended or adjusted under 35 U.S.C. 154(b) by 187 days.

This patent is subject to a terminal disclaimer.

(21) Appl. No.: 14/902,881

(22) PCT Filed: Jul. 2, 2014

(86) PCT No.: PCT/JP2014/003525
§ 371 (c)(1),
(2) Date: Jan. 5, 2016

(87) PCT Pub. No.: WO2015/004882
PCT Pub. Date: Jan. 15, 2015

(65) Prior Publication Data
US 2016/0141539 A1  May 19, 2016

(30) Foreign Application Priority Data
Jul. 11, 2013  (JP) .................................. 2013-145243

(51) Int. Cl.
*H01L 51/50* (2006.01)
*H01L 51/56* (2006.01)
*H01L 51/00* (2006.01)

(52) U.S. Cl.
CPC ...... *H01L 51/5004* (2013.01); *H01L 51/5012* (2013.01); *H01L 51/5076* (2013.01);
(Continued)

(58) Field of Classification Search
CPC ............. H01L 51/5076; H01L 51/5092; H01L 51/508; H01L 51/5072–508; H01L 51/5088–5096
See application file for complete search history.

(56) References Cited

U.S. PATENT DOCUMENTS

| | | | |
|---|---|---|---|
| 6,262,433 B1 | 7/2001 | Arai et al. | |
| 6,483,236 B1 | 11/2002 | Hung | |

(Continued)

FOREIGN PATENT DOCUMENTS

| | | |
|---|---|---|
| EP | 1962354 | 8/2008 |
| JP | 2000-268965 | 9/2000 |

(Continued)

OTHER PUBLICATIONS

Hung, et al. "Voltage reduction in organic light-emitting diodes." Applied Physics Letters 78.23 (2001): 3732-3734.*

(Continued)

*Primary Examiner* — William E McClain
(74) *Attorney, Agent, or Firm* — Greenblum & Bernstein, P.L.C.

(57) ABSTRACT

An organic EL element includes: an anode; a light-emitting layer that is disposed above the anode; a first interlayer that is disposed on the light-emitting layer; a second interlayer that is disposed on the first interlayer; a functional layer that is disposed on the second interlayer; and a cathode that is disposed above the functional layer. The first interlayer includes a fluorine compound including a first metal that is an alkali metal or an alkaline-earth metal. The second interlayer includes a second metal that has a property of (Continued)

cleaving a bond between the first metal and fluorine in the fluorine compound. The functional layer has at least one of an electron transport property and an electron injection property. A thickness D1 of the first interlayer and a thickness D2 of the second interlayer satisfy $3\% \leq D2/D1 \leq 25\%$.

23 Claims, 12 Drawing Sheets

(52) U.S. Cl.
CPC .......... *H01L 51/5092* (2013.01); *H01L 51/56* (2013.01); *H01L 51/007* (2013.01); *H01L 51/0067* (2013.01); *H01L 2251/558* (2013.01)

(56) References Cited

U.S. PATENT DOCUMENTS

| | | | |
|---|---|---|---|
| 6,875,320 | B2 | 4/2005 | Raychaudhuri et al. |
| 7,045,955 | B2 | 5/2006 | Seo et al. |
| 7,116,461 | B2 | 10/2006 | Takei |
| 7,662,487 | B2 | 2/2010 | Iwakuma |
| 7,737,630 | B2 | 6/2010 | Seo et al. |
| 7,759,489 | B2 | 7/2010 | Watanabe et al. |
| 8,093,587 | B2 | 1/2012 | Shiratori et al. |
| 8,445,895 | B2 | 5/2013 | Okumoto et al. |
| 8,492,184 | B2 | 7/2013 | Nishiyama et al. |
| 8,492,754 | B2 | 7/2013 | Nishiyama et al. |
| 8,497,497 | B2 | 7/2013 | Nakajima et al. |
| 8,563,145 | B2 | 10/2013 | Iwakuma et al. |
| 8,889,474 | B2 | 11/2014 | Matsushima |
| 8,906,517 | B2 | 12/2014 | Shibanuma et al. |
| 8,940,412 | B2 | 1/2015 | Takashima et al. |
| 9,196,850 | B2 | 11/2015 | Matsumoto et al. |
| 9,559,327 | B2 * | 1/2017 | Yoneda ............... H01L 51/5253 |
| 2004/0027061 | A1 | 2/2004 | Seo et al. |
| 2004/0174321 | A1 | 9/2004 | Takei |
| 2004/0222737 | A1 | 11/2004 | Raychaudhuri et al. |
| 2005/0098207 | A1 | 5/2005 | Matsumoto et al. |
| 2006/0192484 | A1 | 8/2006 | Seo et al. |
| 2006/0220534 | A1 | 10/2006 | Shibanuma et al. |
| 2007/0176540 | A1 | 8/2007 | Watanabe et al. |
| 2007/0210705 | A1 | 9/2007 | Yokoi et al. |
| 2007/0224446 | A1 | 9/2007 | Nakano et al. |
| 2008/0206597 | A1 | 8/2008 | Iwakuma |
| 2008/0210960 | A1* | 9/2008 | Ha ............... H01L 27/3209 257/96 |
| 2009/0162644 | A1 | 6/2009 | Ricks et al. |
| 2009/0167156 | A1 | 7/2009 | Kawamura et al. |
| 2009/0224658 | A1 | 9/2009 | Iwakuma et al. |
| 2010/0051991 | A1 | 3/2010 | Shiratori et al. |
| 2010/0237341 | A1 | 9/2010 | Okumoto et al. |
| 2010/0283043 | A1 | 11/2010 | Nishimura et al. |
| 2010/0314644 | A1 | 12/2010 | Nishimura et al. |
| 2011/0073846 | A1 | 3/2011 | Nakajima et al. |
| 2011/0315965 | A1 | 12/2011 | Takashima et al. |
| 2012/0119194 | A1* | 5/2012 | Nagai ............... H01L 51/5278 257/40 |
| 2012/0119196 | A1 | 5/2012 | Ogiwara et al. |
| 2012/0187389 | A1* | 7/2012 | Shoda ............... H01L 27/3246 257/40 |
| 2012/0211729 | A1 | 8/2012 | Yamauchi |
| 2013/0033173 | A1 | 2/2013 | Yamauchi |
| 2014/0021461 | A1 | 1/2014 | Iwakuma et al. |
| 2014/0151681 | A1 | 6/2014 | Iwasaki |
| 2014/0159031 | A1 | 6/2014 | Aonuma et al. |
| 2015/0060837 | A1 | 3/2015 | Shibanuma et al. |

FOREIGN PATENT DOCUMENTS

| | | |
|---|---|---|
| JP | 2000-268966 | 9/2000 |
| JP | 2000-268967 | 9/2000 |
| JP | 2002-015873 | 1/2002 |
| JP | 2004-071460 | 3/2004 |
| JP | 2004-288621 | 10/2004 |
| JP | 2004-335468 | 11/2004 |
| JP | 2005-166637 | 6/2005 |
| JP | 2006-287078 | 10/2006 |
| JP | 2008-098475 | 4/2008 |
| JP | 2009-009792 | 1/2009 |
| JP | 2009-170621 | 7/2009 |
| JP | 2010-056211 | 3/2010 |
| JP | 2010-146895 | 7/2010 |
| JP | 4527089 | 8/2010 |
| JP | 2011-049546 | 3/2011 |
| JP | 2011-508421 | 3/2011 |
| JP | 2011-071392 | 4/2011 |
| JP | 2011-146307 | 7/2011 |
| JP | 2011-522391 | 7/2011 |
| JP | 4882508 | 2/2012 |
| JP | 2012-190549 | 10/2012 |
| JP | 2013-012505 | 1/2013 |
| JP | 2013-033872 | 2/2013 |
| WO | 2007/029806 | 3/2007 |
| WO | 2007/069569 | 6/2007 |
| WO | 2007/086505 | 8/2007 |
| WO | 2007/111176 | 10/2007 |
| WO | 2007/142083 | 12/2007 |
| WO | 2008/105294 | 9/2008 |
| WO | 2009/066779 | 5/2009 |
| WO | 2009/085123 | 7/2009 |
| WO | 2009/147801 | 12/2009 |
| WO | 2010/074087 | 7/2010 |
| WO | 2010/143434 | 12/2010 |
| WO | 2013/018251 | 2/2013 |

OTHER PUBLICATIONS

Jun-Song, et al. "Organic light-emitting diodes with magnesium doped CuPc as an efficient electron injection layer." Chinese Physics Letters 25.2 (2008): 719.*

Heil, et al. "Mechanisms of injection enhancement in organic light-emitting diodes through an Al/LiF electrode." Journal of Applied Physics 89.1 (2001): 420-424.*

Xie, et al. "Interfacial reactions at al/lif and lif/al." Applied Physics Letters 94.6 (2009): 40.*

Brown, et al. "LiF/Al cathodes and the effect of LiF thickness on the device characteristics and built-in potential of polymer light-emitting diodes." Applied Physics Letters 77.19 (2000): 3096-3098.*

International Search Report (ISR) from International Searching Authority (Japan Patent Office) in International Pat. Appl. No. PCT/JP2014/003525, dated Sep. 9, 2014.

* cited by examiner

ORGANIC EL ELEMENT AND METHOD FOR MANUFACTURING ORGANIC EL ELEMENT

TECHNICAL FIELD

The present disclosure relates to an organic electroluminescence (EL) element and a manufacturing method of the organic EL element, and particularly to storage stability and luminous property of the organic EL element.

BACKGROUND ART

In recent years, display devices employing an organic EL element have been becoming widespread owing to characteristics of the organic EL element such as a high visibility resulting from self-luminescence and an excellent shock resistance resulting from a fully solid-state structure thereof.

According to a structure of the organic EL element, at least a light-emitting layer is interposed between a pair of electrodes (an anode and a cathode). Further, the organic EL element mostly includes, between the light-emitting layer and the cathode, a functional layer (an electron transport layer, an electron injection layer) for supplying electrons to the light-emitting layer, or a hole injection layer, a hole transport layer, and so on. Also, it is known that an excellent electron injection property is exhibited by the functional layer made of an alkali metal or an alkaline-earth metal having a low work function.

An alkali metal and an alkaline-earth metal, which have a low work function, are easy to react with impurities such as moisture and oxygen. For this reason, impurities degrade the functional layer, which includes an alkali metal or an alkaline-earth metal. This exercises an adverse effect such as degradation of luminous efficiency and reduction of light-emitting lifetime of the organic EL element. As a result, storage stability degrades. Also, contact between impurities and a cathode causes corrosion and degradation of the cathode. This might exercise the same adverse effect as described above.

In view of this problem, Patent Literature 1 discloses an organic EL element including an inorganic barrier layer between a hole injection layer and a hole transport layer, between the hole transport layer and a light-emitting layer, between the light-emitting layer and an electron transport layer, or between the electron transport layer and an electron injection layer (these layers are referred to as organic light-emitting medium layers in Patent Literature 1). The inorganic barrier layers are provided in order to prevent one or more of the organic light-emitting medium layers, which are formed subsequent to the corresponding inorganic barrier layers, from being degraded by impurities that are absorbed onto surfaces of remainder of the organic light-emitting medium layers, which are formed prior to the corresponding inorganic barrier layers (the impurities are referred to as a degradation factor in Patent Literature 1).

CITATION LIST

Patent Literature

[Patent Literature 1] Specification of Japanese Patent No. 4882508

SUMMARY OF INVENTION

Technical Problem

According to the organic EL element disclosed in Patent Literature 1, however, the inorganic barrier layers are each made of insulator, semiconductor, or metal having a work function of 4.0 eV or higher, and has a low electron injection property. Accordingly, sufficient electrons are not supplied to a light-emitting layer, and as a result an excellent luminous property might not be exhibited.

The present disclosure was made in view of the above problem, and aims to provide an organic EL element and a manufacturing method of the organic EL element according to which an excellent storage stability is exhibited by achieving a sufficient property of blocking impurities, and an excellent luminous property is exhibited.

Solution to Problem

An organic EL element according to one aspect of the present disclosure comprises: an anode; a light-emitting layer that is disposed above the anode; a first interlayer that is disposed on the light-emitting layer, and includes a fluorine compound including a first metal that is an alkali metal or an alkaline-earth metal; a second interlayer that is disposed on the first interlayer, and includes a second metal that has a property of cleaving a bond between the first metal and fluorine in the fluorine compound; a functional layer that is disposed on the second interlayer, and has at least one of an electron transport property and an electron injection property; and a cathode that is disposed above the functional layer, wherein a thickness D1 of the first interlayer and a thickness D2 of the second interlayer satisfy $3\% \leq D2/D1 \leq 25\%$.

A manufacturing method of the organic EL element relating to the one aspect of the present disclosure comprises: forming an anode; forming, above the anode, a light-emitting layer; forming, on the light-emitting layer, a first interlayer that has a thickness D1, and includes a fluorine compound including a first metal that is an alkali metal or an alkaline-earth metal; forming, on the first interlayer, a second interlayer that has a thickness D2, and includes a second metal that has a property of cleaving a bond between the first metal and fluorine in the fluorine compound; forming, on the second interlayer, a functional layer that has at least one of an electron transport property and an electron injection property; and forming, above the functional layer, a cathode, wherein the thickness D1 and the thickness D2 satisfy $3\% \leq D2/D1 \leq 25\%$.

An organic EL element relating to another aspect of the present disclosure comprises: an anode; a light-emitting layer that is disposed above the anode; an interlayer that is disposed on the light-emitting layer; a functional layer that is disposed on the interlayer, and has at least one of an electron transport property and an electron injection property; and a cathode that is disposed above the functional layer, wherein the interlayer includes: a fluorine compound including a first metal that is an alkali metal or an alkaline-earth metal; and a second metal that has a property of cleaving a bond between the first metal and fluorine in the fluorine compound, a concentration of the first metal in the interlayer increases as approaching the light-emitting layer from the functional layer, and a concentration of the second metal in the interlayer increases as approaching the functional layer from the light-emitting layer.

Advantageous Effects of Invention

The organic EL element relating to the one aspect of the present disclosure includes the first interlayer and the second interlayer. The first interlayer includes a fluorine compound including the first metal that is an alkali metal or an alkaline-earth metal. Accordingly, the first interlayer has a high property of blocking impurities. This blocks intrusion of impurities from the light-emitting layer to prevent degradation of the functional layer, and thereby exhibits an excellent storage stability. Also, the second metal, which is included in the second interlayer, cleaves the bond between the first metal and fluorine in the fluorine compound including the first metal, which is included in the first interlayer, to liberate the first metal. The liberated first metal is an alkali metal or an alkaline-earth metal, and accordingly has a low work function and a high electron injection property. Therefore, electrons are sufficiently supplied to the light-emitting layer.

Here, if an amount of the liberated first metal is small, electrons are not sufficiently supplied to the light-emitting layer, and as a result a sufficient luminance is not exhibited. If an amount of the liberated first metal is excessively large on the contrary, an amount of supplied electrons is excessively large relative to an amount of holes in the light-emitting layer. This results in degradation of luminous efficiency (luminance relative to current).

According to the organic EL element relating to the one aspect of the present disclosure, the thickness D1 of the first interlayer and the thickness D2 of the second interlayer satisfy a preferable relation $3\% \leq D2/D1 \leq 25\%$ in terms of balance between the property of blocking impurities and an electron supply property. Therefore, an excellent luminous property is exhibited.

Also according to the manufacturing method of the organic EL element relating to the one aspect of the present disclosure, the same effects as the above are exhibited.

According to the organic EL element relating to the one aspect of the present disclosure, a concentration of the fluorine compound including the first metal, which has a high property of blocking impurities in the interlayer, increases as approaching the light-emitting layer from the functional layer. Also, a concentration of the second metal in the interlayer increases as approaching the functional layer from the light-emitting layer. Therefore, the second metal is less likely to liberate the first metal on the side of the light-emitting layer in the intermediate layer, and accordingly the property of blocking impurities does not degrade. Therefore, it is possible to prevent intrusion of impurities from the light-emitting layer by including the fluorine compound of the first metal in the interlayer. Also, since the second metal liberates the first metal mainly on the side of the functional layer in the interlayer, an excellent electron injection property relating to the light-emitting layer is exhibited.

BRIEF DESCRIPTION OF DRAWINGS

FIG. 7A shows a state in which a TFT layer and an interlayer insulating layer are formed on a base material, FIG. 7B shows a state in which a pixel electrode is formed on the interlayer insulating layer, and FIG. 7C shows a state in which a barrier rib material layer is formed on the interlayer insulating layer and the pixel electrode.

FIG. 8A shows a state in which a barrier rib layer is formed, FIG. 8B shows a state in which a hole injection layer is formed on the pixel electrode within an opening of the barrier rib layer, and FIG. 8C shows a state in which a hole transport layer is formed on the hole injection layer within the opening of the barrier rib layer.

FIG. 9A shows a state in which a light-emitting layer is formed on the hole transport layer within the opening of the barrier rib layer, FIG. 9B shows a state in which a first interlayer is formed on the light-emitting layer and the barrier rib layer, and FIG. 9C shows a state in which a second interlayer is formed on the first interlayer.

FIG. 10A shows a state in which a functional layer is formed on the second interlayer, FIG. 10B shows a state in which a counter electrode is formed on the functional layer, and FIG. 10C shows a state in which a sealing layer is formed on the counter electrode.

DESCRIPTION OF EMBODIMENTS

Figure 1:
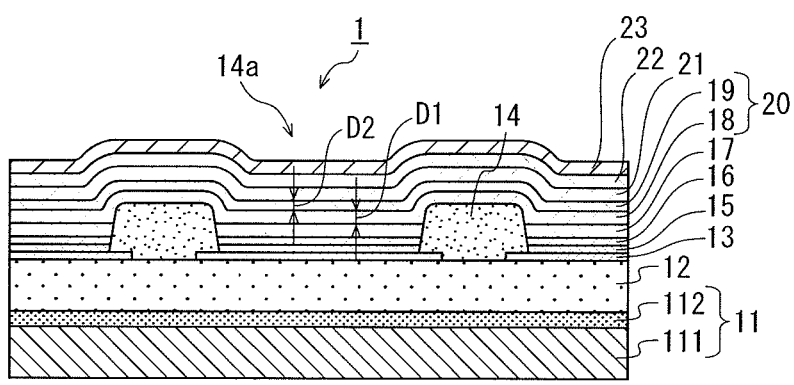
FIG. 1 is a cross-sectional view schematically showing a structure of an organic EL element relating to an embodiment of the present disclosure.

<Outline of One Aspect of the Present Disclosure>

An organic EL element relating to one aspect of the present disclosure comprises: an anode; a light-emitting layer that is disposed above the anode; a first interlayer that is disposed on the light-emitting layer, and includes a fluorine compound including a first metal that is an alkali metal or an alkaline-earth metal; a second interlayer that is disposed on the first interlayer, and includes a second metal that has a property of cleaving a bond between the first metal and fluorine in the fluorine compound; a functional layer that is disposed on the second interlayer, and has at least one of an electron transport property and an electron injection property; and a cathode that is disposed above the functional layer, wherein a thickness D1 of the first interlayer and a thickness D2 of the second interlayer satisfy 3%≤D2/D1≤25%.

With this structure, the ratio of the thickness D2 of the second interlayer to the thickness D1 of the first interlayer is preferable in terms of the balance between the property of blocking impurities and the electron supply property. Therefore, an excellent luminous property is exhibited.

Also, according to the organic EL element relating to the one aspect of the present disclosure, the second metal is an alkali metal or an alkaline-earth metal.

The second metal is an alkali metal or an alkaline-earth metal, which has a comparatively low work function and a comparatively high electron supply property. Therefore, the second metal has a comparatively high reactivity with fluorine and easily cleaves the bond between the first metal and fluorine.

Also, according to the organic EL element relating to the one aspect of the present disclosure, the thickness D1 is 1 nm to 10 nm.

With this structure, it is possible to set the thickness D1 of the first interlayer to have a value necessary for exhibiting a sufficient property of blocking impurities and preventing degradation of the electron injection property due to an excessively large value of the thickness D1.

Also, according to the organic EL element relating to the one aspect of the present disclosure, the thickness D2 is 0.1 nm to 1 nm.

With this structure, the second interlayer exhibits a preferable electron injection property for injecting electrons, whose amount is neither too large nor too small, to the light-emitting layer. This exhibits an excellent luminous efficiency.

Also, according to the organic EL element relating to the one aspect of the present disclosure, the functional layer is made of an organic material that is doped with an alkali metal or an alkaline-earth metal.

With this structure, the functional layer has an electron transport property, and electrons are effectively supplied from the cathode to the light-emitting layer.

Also, according to the organic EL element relating to the one aspect of the present disclosure, a concentration of the alkali metal or the alkaline-earth metal in the organic material is 5 wt % to 40 wt %.

With this structure, the functional layer has a preferable electron supply property, and therefore an excellent luminous efficiency is exhibited.

Also, according to the organic EL element relating to the one aspect of the present disclosure, the alkali metal or the alkaline-earth metal with which the organic material is doped is the same as the second metal.

With this structure, the second interlayer and the functional layer are made of the same material, and therefore the organic EL element is easily manufactured.

Also, according to the organic EL element relating to the one aspect of the present disclosure, the alkali metal or the alkaline-earth metal with which the organic material is doped and the second metal are each barium.

With this structure, the second interlayer and the functional layer are made of barium, which is a versatile material, and therefore cost reduction is achieved.

Also, according to the organic EL element relating to the one aspect of the present disclosure, the first metal is sodium.

With this structure, the first interlayer includes sodium fluoride having a low hygroscopicity and a low reactivity with oxygen, and therefore has an excellent property of blocking impurities. Also, sodium has a low work function and a high electron injection property, and therefore electrons are effectively supplied to the light-emitting layer.

A manufacturing method of the organic EL element relating to the one aspect of the present disclosure comprises: forming an anode; forming, above the anode, a light-emitting layer; forming, on the light-emitting layer, a first interlayer that has a thickness D1, and includes a fluorine compound including a first metal that is an alkali metal or an alkaline-earth metal; forming, on the first interlayer, a second interlayer that has a thickness D2, and includes a second metal that has a property of cleaving a bond between the first metal and fluorine in the fluorine compound; forming, on the second interlayer, a functional layer that has at least one of an electron transport property and an electron injection property; and forming, above the functional layer, a cathode, wherein the thickness D1 and the thickness D2 satisfy 3%≤D2/D1≤25%.

With this structure, the ratio of the thickness D2 of the second interlayer to the thickness D1 of the first interlayer is preferable in terms of the balance between the property of blocking impurities and an electron supply property. Therefore, it is possible to manufacture the organic EL element having an excellent luminous property.

Also, according to the manufacturing method of the organic EL element relating to the other aspect of the present disclosure, the second metal is an alkali metal or an alkaline-earth metal.

With this structure, the second metal is an alkali metal or an alkaline-earth metal, which has a comparatively low work function and a comparatively high electron supply property. Therefore, the second metal has a comparatively high reactivity with fluorine and easily cleaves the bond between the first metal and fluorine.

Also, according to the manufacturing method of the organic EL element relating to the other aspect of the present disclosure, the thickness D1 is 1 nm to 10 nm.

With this structure, it is possible to manufacture the organic EL element including the first interlayer that has a thickness necessary for exhibiting an excellent property of blocking impurities to a degree that the electron injection property is not impaired.

Also, according to the manufacturing method of the organic EL element relating to the other aspect of the present disclosure, the thickness D2 is 0.1 nm to 1 nm.

With this structure, it is possible to manufacture the organic EL element including the second interlayer that has a preferable electron injection property for injecting electrons, whose amount is neither too large nor too small, to the light-emitting layer.

Also, according to the manufacturing method of the organic EL element relating to the other aspect of the present disclosure, the functional layer is formed by doping an organic material with an alkali metal or an alkaline-earth metal.

With this structure, it is possible to manufacture the organic EL element including the functional layer having the electron transport property.

Also, according to the manufacturing method of the organic EL element relating to the other aspect of the present disclosure, a concentration of the alkali metal or the alkaline-earth metal in the organic material is 5 wt % to 40 wt %.

With this structure, it is possible to manufacture the organic EL element that exhibits an excellent luminous efficiency by including the functional layer having a preferable electron transport property.

Also, according to the manufacturing method of the organic EL element relating to the other aspect of the present disclosure, the alkali metal or the alkaline-earth metal with which the organic material is doped is the same as the second metal.

With this structure, the second interlayer and the functional layer are made of the same material, and therefore the organic EL element is easily manufactured.

Also, according to the manufacturing method of the organic EL element relating to the other aspect of the present disclosure, the alkali metal or the alkaline-earth metal with which the organic material is doped and the second metal are each barium.

With this structure, the second interlayer and the functional layer are made of barium, which is a versatile material, and therefore cost reduction is achieved.

Also, according to the manufacturing method of the organic EL element relating to the other aspect of the present disclosure, the first metal is sodium.

With this structure, it is possible to manufacture the organic EL element including the first interlayer that has an excellent property of blocking impurities by including sodium fluoride having a low hygroscopicity and a low reactivity with oxygen. Also, sodium has a low work function and a high electron injection property, and therefore electrons are effectively supplied to the light-emitting layer.

An organic EL element relating to another aspect of the present disclosure comprises: an anode; a light-emitting layer that is disposed above the anode; an interlayer that is disposed on the light-emitting layer; a functional layer that is disposed on the interlayer, and has at least one of an electron transport property and an electron injection property; and a cathode that is disposed above the functional layer, wherein the interlayer includes: a fluorine compound including a first metal that is an alkali metal or an alkaline-earth metal; and a second metal that has a property of cleaving a bond between the first metal and fluorine in the fluorine compound, a concentration of the first metal in the interlayer increases as approaching the light-emitting layer from the functional layer, and a concentration of the second metal in the interlayer increases as approaching the functional layer from the light-emitting layer.

With this structure, the second metal is less likely to liberate the first metal on the side of the light-emitting layer in the intermediate layer, and accordingly the property of blocking impurities does not degrade. Therefore, it is possible to prevent intrusion of impurities from the light-emitting layer by including the fluorine compound of the first metal in the interlayer. Also, since the second metal liberates the first metal mainly on the side of the functional layer in the interlayer, an excellent electron injection property relating to the light-emitting layer is exhibited. In this way, it is possible to exhibit an excellent luminous property by including the interlayer having the preferably balanced property of blocking impurities and electron supply property.

Also, according to the organic EL element relating to the other aspect of the present disclosure, the second metal is an alkali metal or an alkaline-earth metal.

With this structure, the second metal is an alkali metal or an alkaline-earth metal, which has a comparatively low work function and a comparatively high electron supply property. Therefore, the second metal has a comparatively high reactivity with fluorine and easily cleaves the bond between the first metal and fluorine.

Also, according to the organic EL element relating to the other aspect of the present disclosure, the functional layer includes an organic material that is doped with an alkali metal or an alkaline-earth metal.

With this structure, the functional layer has an electron transport property, and electrons are effectively supplied from the cathode to the light-emitting layer.

Also, according to the organic EL element relating to the other aspect of the present disclosure, a concentration of the alkali metal or the alkaline-earth metal in the organic material is 5 wt % to 40 wt %.

With this structure, the functional layer has a preferable electron supply property, and therefore an excellent luminous efficiency is exhibited.

Also, according to the organic EL element relating to the other aspect of the present disclosure, the alkali metal or the alkaline-earth metal with which the organic material is doped is the same as the second metal.

With this structure, the second interlayer and the functional layer are made of the same material, and therefore the organic EL element is easily manufactured.

Also, according to the organic EL element relating to the other aspect of the present disclosure, the alkali metal or the alkaline-earth metal with which the organic material is doped and the second metal are each barium.

With this structure, the second interlayer and the functional layer are made of barium, which is a versatile material, and therefore cost reduction is achieved.

Also, according to the organic EL element relating to the other aspect of the present disclosure, the first metal is sodium.

With this structure, it is possible to manufacture the organic EL element including the first interlayer that has an excellent property of blocking impurities by including sodium fluoride having a low hygroscopicity and a low reactivity with oxygen. Also, sodium has a low work function and a high electron injection property, and therefore electrons are effectively supplied to the light-emitting layer.

The following explains structures and effects of the present disclosure with specific examples.

Note that an embodiment in the following explanation is just an example for simply explaining the structures and effects relating to one aspect of the present disclosure. The present disclosure is not limited to the embodiment except for essential part of the present disclosure.

Embodiment

1. Structure of Organic EL Element

The following explains a structure of an organic EL element relating to an embodiment as one aspect of the present disclosure, with reference to FIG. 1.

FIG. 1 is a partially enlarged cross-sectional view showing an organic EL display panel 100 (see FIG. 12) including a plurality of organic EL elements 1 relating to the present embodiment, specifically showing a cross-section of part corresponding to one organic EL element 1 and the vicinity thereof. In the present embodiment, one organic EL element 1 corresponds to one subpixel. The organic EL element 1 is of a so-called top-emission type that has a display surface on the upper side in FIG. 1.

As shown in FIG. 1, the organic EL element 1 includes a substrate 11, an interlayer insulating layer 12, a pixel electrode 13, a barrier rib layer 14, a hole injection layer 15, a hole transport layer 16, a light-emitting layer 17, a first interlayer 18, a second interlayer 19, a functional layer 21, a counter electrode 22, and a sealing layer 23. Note that the substrate 11, the interlayer insulating layer 12, the first interlayer 18, the second interlayer 19, the functional layer 21, the counter electrode 22, and the sealing layer 23 are formed not for each of the subpixels (the organic EL elements 1), but for the entire organic EL elements 1 included in the organic EL display panel 100.

<Substrate>

The substrate 11 includes a base material 111 that is an insulating material and a thin film transistor (TFT) layer 112. The TFT layer 112 includes drive circuits formed therein each of the subpixels. The base material 111 is made for example of a glass material such as non-alkali glass, soda glass, non-fluorescent glass, phosphoric glass, boric gas, and quartz.

<Interlayer Insulating Layer>

The interlayer insulating layer 12 is formed on the substrate 11. The interlayer insulating layer 12 is provided in order to flatten unevenness on an upper surface of the TFT layer 112. The interlayer insulating layer 12 is made of a resin material such as a positive photosensitive material. Such a photosensitive resin material is acrylic resin, polyimide resin, siloxane resin, or phenol resin. Also, although not shown in the cross-sectional view in FIG. 1, the interlayer insulating layer 12 has a contact hole formed therein for each of the subpixels.

<Pixel Electrode>

The pixel electrode 13 is made of a conductive material. The pixel electrode 13 is formed on the interlayer insulating layer 12 for each of the subpixels, and is electrically connected with the TFT layer 112 via a corresponding contact hole. In the present embodiment, the pixel electrode 13 functions as an anode, and should be made of a light-reflective conductive material because the organic EL display panel 100 is of the top-emission type. The light-reflective conductive material is for example metal. Specific examples of such metal include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In the case where the organic EL display panel 100 is of a bottom-emission type, the pixel electrode 13 should be made of a light-transmissive material. A light-transmissive conductive material is for example indium tin oxide (ITO), indium zinc oxide (IZO), or zinc oxide (ZnO).

<Barrier Rib Layer>

The barrier rib layer 14 is formed on the pixel electrode 13 so as to expose a partial region of an upper surface of the pixel electrode 13 and cover a peripheral region of the partial region. The partial region of the upper surface of the pixel electrode 13 that is not covered with the barrier rib layer 14 (hereinafter, referred to as an opening) corresponds to a subpixel. In other words, the barrier rib layer 14 has an opening 14a that is provided for each subpixel.

In the present embodiment, at a part where the pixel electrode 13 is not formed, the barrier rib layer 14 is formed on the interlayer insulating layer 12. In other words, at a part where the pixel electrode 13 is not formed, a bottom surface of the barrier rib layer 14 is in contact with an upper surface of the interlayer insulating layer 12.

The barrier rib layer 14 is made for example of an insulating organic material such as acrylic resin, polyimide resin, novolac resin, and phenol resin. In the case where the light-emitting layer 17 is formed using an applying method, the barrier rib layer 14 functions as a structure for preventing overflow of an applied ink. In the case where the light-emitting layer 17 is formed using a vapor deposition method, the barrier rib layer 14 functions as a structure for placing a vapor deposition mask. In the present embodiment, the barrier rib layer 14 is made of a resin material such as a positive photosensitive resin material. Such a photosensitive resin material is acrylic resin, polyimide resin, siloxane resin, or phenol resin. In the present embodiment, phenol resin is used.

The hole injection layer 15 is provided on the pixel electrode 13 within the opening 14a in order to promote injection of holes from the pixel electrode 13 to the light-emitting layer 17. The hole injection layer 15 is made for example of oxide of a metal such as silver (Ag), molybdenum (Mo), chromium (Cr), vanadium (V), tungsten (W), nickel (Ni), and iridium (Ir) or a conductive polymer material such as polyethylenedioxythiophene (PEDOT). Such a metal oxide has a function of assisting generation of holes and stably injecting the holes to the light-emitting layer 17. The hole injection layer 15 has a high work function. In the present embodiment, the hole injection layer 15 is made of a conductive polymer material such as PEDOT.

Here, in the case where the hole injection layer 15 is made of oxide of transition metal, the hole injection layer 15 has a plurality of energy levels because oxide of transition metal has a plurality of oxidation numbers. This facilitates hole injection, and therefore reduces driving voltage.

<Hole Transport Layer>

The hole transport layer 16 is formed within the opening 14a. The hole transport layer 16 is made of a high-molecular compound that does not have hydrophilic group. Such a high-molecular compound is for example, polyfluorene, polyfluorene derivative, polyallylamine, or polyallylamine derivative.

The hole transport layer 16 has a function of transporting holes, which are injected by the hole injection layer 15, to the light-emitting layer 17.

<Light-Emitting Layer>

The light-emitting layer 17 is formed within the opening 14a. The light-emitting layer 17 is made of a material corresponding to a luminance color of any of R (red), G (green), and B (blue). The light-emitting layer 17 has a function of emitting light of a corresponding one of the R, G, and B colors owing to recombination of holes and electrons. The light-emitting layer 17 is made of a known material. The known material is for example oxinoid compound, perylene compound, coumarin compound, azacouramin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-2'-bipyridine compound, complex of a Schiff base and group III metal, oxine metal complex, fluorescent substance such as rare earth complex, or phosphor substance emitting phosphor light such as tris(2-phenylpyridine) iridium.

<First Interlayer>

The first interlayer 18 is formed on the light-emitting layer 17. The first interlayer 18 is provided in order to prevent impurities, which exist within or on respective surfaces of the light-emitting layer 17, the hole transport layer 16, the hole injection layer 15, and the barrier rib layer 14, from intruding into the functional layer 21 and the counter electrode 22. For this reason, the first interlayer 18 includes a material having a property of blocking impurities, such as alkali metal fluoride and alkaline-earth metal fluoride. More specifically, sodium fluoride (NaF) is used as the material included in the first interlayer 18 in the present embodiment. An alkali metal in alkali metal fluoride or an alkaline-earth metal in alkaline-earth metal fluoride, which is included in the first interlayer 18, is hereinafter referred to as a first metal.

Also, the first interlayer 18 has a thickness D1 [nm].

<Second Interlayer>

The second interlayer 19 is formed on the first interlayer 18. The second interlayer 19 includes a metal that cleaves a bond between the first metal and fluorine in the fluoride of the first metal included in the first interlayer 18. This metal is hereinafter referred to as a second metal. The second metal, which cleaves the bond between the first metal and fluorine, is for example an alkali metal or an alkaline-earth metal. In the present embodiment, the second metal is specifically barium (Ba).

Also, the second interlayer 19 has a thickness D2 [nm].

Note that the first interlayer 18 and the second interlayer 19 constitute an interlayer 20.

<Functional Layer>

The functional layer 21 is formed on the second interlayer 19, and has a function of transporting holes, which are injected by the counter electrode 22, to the light-emitting layer 17. In the present embodiment, the functional layer 21 is an electron transport layer that is made of an organic material doped with a metal. The organic material of the functional layer 21 is for example a n-electron low molecular organic material such as oxadiazole derivative (OXD), triazole derivative (TAZ), and phenanthroline derivative (BCP, Bphen). The metal with which the organic material is doped (hereinafter, referred to as a doping metal) is an alkali metal or an alkaline-earth metal. More specifically, the doping metal is for example a metal having a low work function such as lithium, barium, calcium, potassium, cesium, sodium, and rubidium, a metal salt having a low work function such as lithium fluoride, a metal oxide having a low work function such as barium oxide, or a metal organic complex having a low work function such as lithium quinolinol.

<Counter Electrode>

The counter electrode 22 is provided for the entire sub-pixels in common. The counter electrode 22 is made of a light-transmissive conductive material such as ITO and IZO. In the present embodiment, the counter electrode 22 functions as a cathode.

<Sealing Layer>

The sealing layer 23 is provided on the counter electrode 22 in order to suppress degradation of the light-emitting layer 17 due to exposure to moisture, oxygen, and so on. Since the organic EL display panel 100 is of the top-emission type, the sealing layer 23 is made of a light-transmissive material such as silicon nitride (SiN) and silicon oxynitride (SiON).

<Others>

Although not shown in FIG. 1, a color filter, an upper substrate, and so on may be adhered onto the sealing layer 23. Adherence of the upper substrate protects the hole transport layer 16, the light-emitting layer 17, and the functional layer 21 against moisture, air, and so on.

2. Property of Blocking Impurities and Electron Injection Property

In the case where the hole injection layer 15, the hole transport layer 16, and the light-emitting layer 17 are formed by a wet process, when impurities, which exist within or on the respective surfaces of these layers, reach the functional layer 21, the impurities react with the metal with which the organic material included in the functional layer 21 is doped. This degrades the function of the functional layer 21. Also, when the impurities react with the organic material, the organic material degrades and this might impair stability.

Also in the case where the barrier rib layer 14 is formed by the wet process, impurities, which exist within or on the surface of the barrier rib layer 14, causes a problem such as described above.

In view of this, the organic EL element 1 relating to the present embodiment includes the first interlayer 18 and the second interlayer 19 between the light-emitting layer 17 and the functional layer 21. The first interlayer 18 includes NaF. NaF has an excellent property of blocking impurities because of having a low hygroscopicity and a lower reactivity with oxygen than an alkali metal and an alkaline-earth metal. Accordingly, the first interlayer 18 prevents intrusion of the impurities from the light-emitting layer 17. This prevents reaction of alkali metal or alkaline-earth metal included in the functional layer 21 with impurities, and suppresses degradation of an electron supply property of the functional layer 21. Further, in the case where the counter electrode 22 is made of metal such as Al and MgAg, degradation of the counter electrode 22 due to impurities is prevented.

On the other hand, NaF has a high electron insulating property, and this causes a problem that NaF blocks movement of electrons, which are supplied from the counter electrode 22 and the functional layer 21, to the light-emitting layer 17, and as a result degrades luminous property.

In view of this, the organic EL element 1 relating to the present embodiment includes the second interlayer 19 between the first interlayer 18 and the functional layer 21. The second interlayer 19 includes Ba as the second metal. Ba cleaves the bond between Na and fluorine (F) in fluoride of Na (NaF), which is fluoride of the first metal included in the first interlayer 18. Accordingly, part of NaF in the first interlayer 18 may dissociate and Na may be liberated. Na has a low work function and a high electron supply property, and accordingly assists movement of electrons from the functional layer 21 to the light-emitting layer 17. This suppresses degradation of the luminous property. Also, remainder of NaF which is not liberated in the first interlayer 18 exhibits a further excellent property of blocking impurities.

Note that the mechanism that cleaves the bond between the first metal and fluorine in the fluoride of the first metal is not limited to the above. Any mechanism may cleave the bond between the first metal and fluorine unless the mechanism impairs the functions of the first interlayer 18, the second interlayer 19, the light-emitting layer 17, and the functional layer 21, and so on.

As described above, the first interlayer 18 includes the fluoride of the first metal, which has a high property of blocking impurities, and accordingly prevents intrusion of impurities from the light-emitting layer 17, and suppresses degradation of the electron supply property of the functional layer 21 (and the counter electrode 22). Also, the second interlayer 19 includes the second metal, which cleaves the bond between the first metal and fluorine. Accordingly, the first metal is liberated, and this facilitates movement of electrons to from the functional layer 21 to the light-emitting layer 17 through the first interlayer 18 which has a high insulating property. As a result, an excellent luminous efficiency is exhibited.

Note that there is a case where the actual boundary between the first interlayer 18 and the second interlayer 19 is not clearly defined, and the material included in the first interlayer 18 and the material included in the second interlayer 19 are mixed together to a certain degree during the manufacturing process thereof. That is, the first interlayer 18 and the second interlayer 19 do not necessarily have the precise thickness D1 and D2, respectively, and the boundary therebetween is sometimes unclear. In this case, concentration of the first metal in the interlayer 20 is higher on the side of the light-emitting layer 17 than on the side of the functional layer 21, and concentration of the second metal in the interlayer 20 is higher on the side of the functional layer 21 than on the side of the light-emitting layer 17. In other words, the concentration of the first metal in the interlayer 20 increases as approaching the light-emitting layer 17 from the functional layer 21, and the concentration of the second metal in the interlayer 20 increases as approaching the functional layer 21 from the light-emitting layer 17.

Here, in the case where the first interlayer 18 and the second interlayer 19 are formed by methods intended to form the first interlayer 18 and the second interlayer 19 having the thickness D1 and D2, respectively, the formed first interlayer 18 and second interlayer 19 are regarded as having the thickness D1 and D2, respectively, if not actually having the thickness D1 and D2. The same applies to the thickness of other layers in the present embodiment as well as modifications which are explained later.

3. Effects of Second Interlayer

Figure 2:
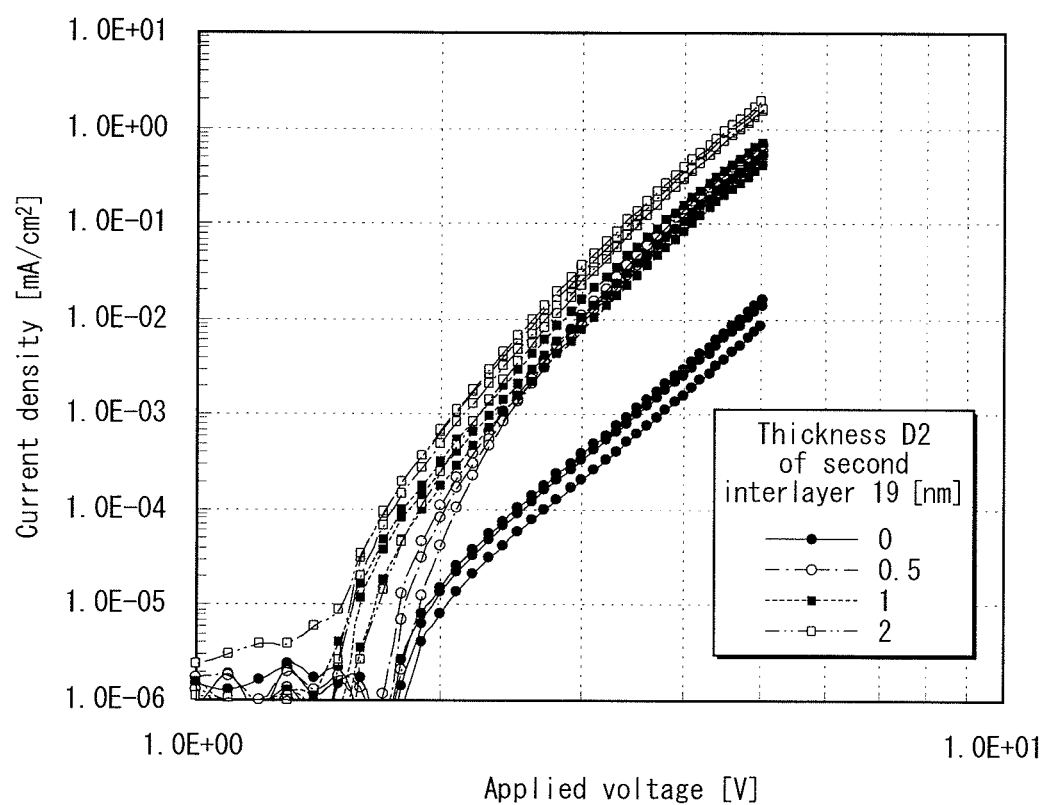
FIG. 2 is a graph showing a relation between voltage and current density with respect to four specimens each including a second interlayer having a different thickness.

FIG. 2 is a graph showing results of measurement of current density by applying voltage to each of four specimens of the organic EL display panel 100. The four specimens differ from each other in the thickness D2 of the second interlayer 19. Specifically, the respective four specimens include the second interlayer 19 having the thickness D2 of 0 nm, 0.5 nm, 1 nm, and 2 nm. The current density was measured with respect to cells (different organic EL elements 1) included in each of the specimens by varying an application voltage.

The four specimens each include the first interlayer 18 having the thickness D1 of 4 nm.

As shown in FIG. 2, compared with the specimen including the second interlayer 19 having the thickness D2 of 0 nm (that is, the specimen not including the second interlayer 19), a high current density was observed with respect to the respective specimens including the second interlayer 19 having the thickness D2 of 0.5 nm, 1 nm, and 2 nm. The results demonstrate that provision of the second interlayer 19 supplies a higher current to the organic EL element 1. In other words, provision of the second interlayer 19 supplies a higher current to the light-emitting layer 17, and thereby exhibits an effect of an improved luminance of the organic EL element 1.

Also, in comparison among the three specimens including the second interlayer 19 having the thickness D2 of 0.5 nm, 1 nm, and 2 nm, the highest current density was observed with respect to the specimen including the second interlayer 19 having thickness D2 of 2 nm. However, compared with a difference in current density between the respective two specimens including the second interlayer 19 having thickness D2 of 0 nm and 0.5 nm, a small difference exists in current density among the three specimens. Therefore, a sufficient thickness D2 of the second interlayer 19 is 0.5 or more.

4. Thickness of Second Interlayer and Luminous Efficiency Ratio

Figure 3:
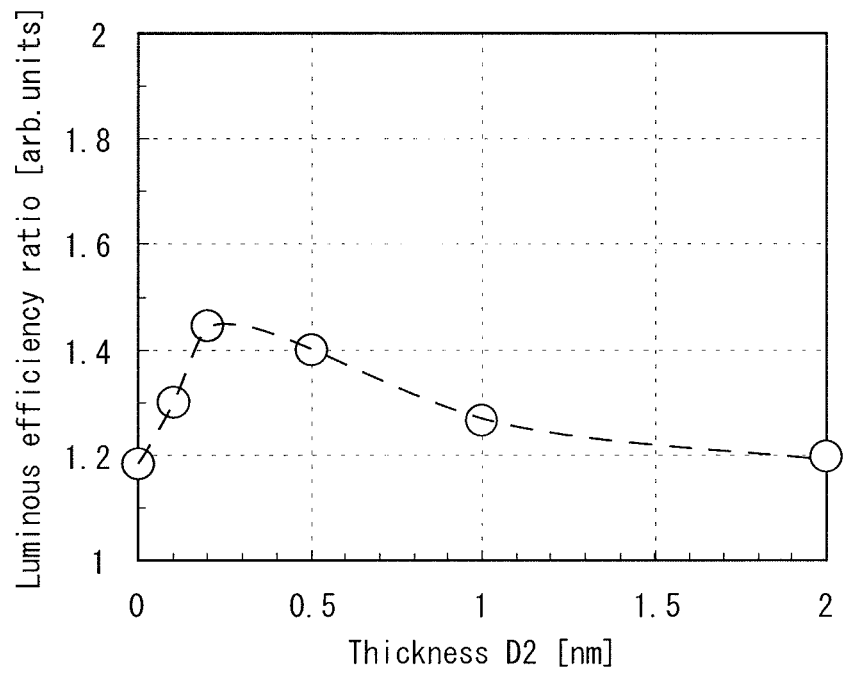
FIG. 3 is a graph showing luminous efficiency ratio that varies in accordance with variation of the thickness of the second interlayer.

FIG. 3 is a graph showing luminous efficiency ratio with respect to six specimens of the organic EL display panel 100. The six specimens differ from each other in the thickness D2 of the second interlayer 19. The respective six specimens include the second interlayer 19 having the thickness D2 of 0 nm, 0.1 nm, 0.2 nm, 0.5 nm, 1 nm, and 2 nm. With respect to each of the six specimens including the second interlayer 19 having a different thickness, luminance was measured by applying voltage to the specimen such that current density is 10 mA/cm$^2$, and luminous efficiency was calculated from the measured luminance. Then, a ratio of the calculated luminous efficiency to a reference value for luminous efficiency of the organic EL display panel (luminous efficiency ratio) was plotted on the graph.

The reference value for luminous efficiency used here was a value of luminous efficiency of an organic EL display panel that does not include the second interlayer 19 and includes the hole transport layer 16 having a low hole injection property (specifically, tungsten oxide).

As shown in FIG. 3, the highest luminous efficiency ratio was observed with respect to the specimen including the second interlayer 19 having the thickness D2 of 0.2 nm. Also, substantially the same luminous efficiency ratio was observed with respect to the respective specimens including the second interlayer 19 having the thickness D2 of 2 nm and 0 nm. This is because of the following reason. A constant amount of holes are injected from the hole transport layer 16 to the light-emitting layer 17. Accordingly, even if an amount of electrons that is excessively high relative to the constant amount of holes is injected to the light-emitting layer 17 and thereby the current increases, the luminance does not increase. As a result, the luminous efficiency decreased, and the luminous efficiency ratio also decreased.

As shown in FIG. 3, substantially the same luminous efficiency ratio was observed with respect to the respective specimens including the second interlayer 19 having the thickness D2 of 2 nm and 0 nm. In the present embodiment, accordingly, an effective range of the thickness D2 of the second interlayer 19 is 0.1 nm to 1 nm. Further, since the thickness D2 of the second interlayer 19 is 1 nm or less, a low amount of light absorbed by the second interlayer 19 is achieved and an excellent light extraction efficiency is exhibited even in the organic EL display panel 100 of the top-emission type.

The six specimens each include the first interlayer 18 having the thickness D1 of 4 nm.

5. Thickness of First Interlayer and Storage Stability

Figure 4A:
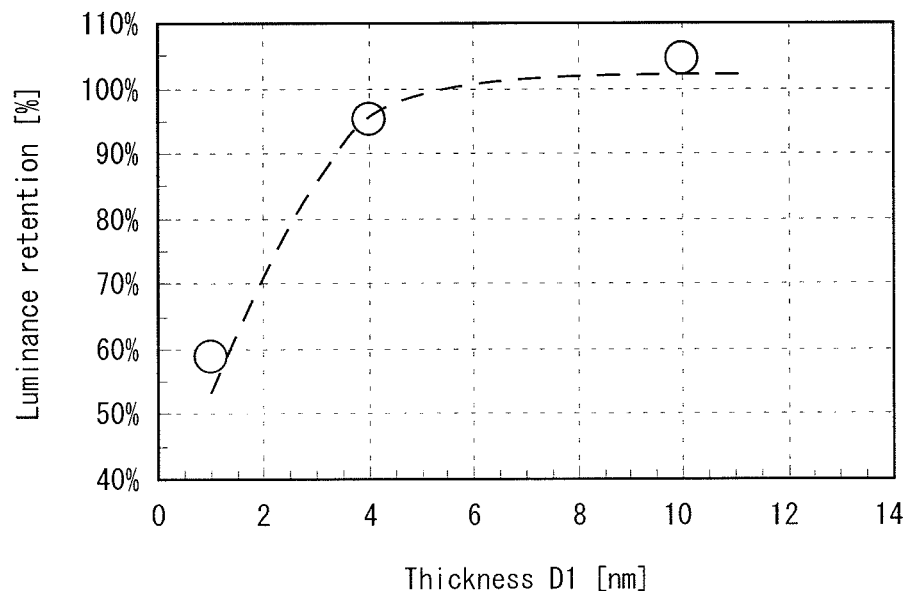
FIG. 4A is a graph showing luminance retention that varies in accordance with variation of thickness of a first interlayer.

FIG. 4A is a graph showing results of a test of storage stability performed with respect to three specimens of the organic EL display panel 100. The three specimens differ from each other in the thickness D1 of the first interlayer 18. The storage stability was assessed using the luminance retention after storage at a high temperature. The respective three specimens include the second interlayer 19 having the thickness D2 of 1 nm, 4 nm, and 10 nm. The test of storage stability was performed in the following manner. Initial luminance was measured by supplying power to the specimen, the specimen was stored in an atmosphere of 80 degrees C. for seven days, and then luminance was measured again by supplying power to the specimen. Then, luminance retention [%] (ratio of the luminance after storage at a high temperature to the initial luminance) was calculated with respect to the specimen. Results of this calculation are plotted in FIG. 4A.

As shown in FIG. 4A, with respect to the specimen including the first interlayer 18 having the thickness D1 of 1 nm, a luminance retention of 59% was observed and an excellent storage stability was not exhibited. With respect to the specimen including the first interlayer 18 having the thickness D1 of 4 nm or more, a luminance retention of 95% or higher was observed and an excellent storage stability was exhibited. This demonstrates that it is possible to exhibit an excellent storage stability by setting the first interlayer 18 to have the thickness D1 of 4 nm or more.

Note that a luminance retention of more than 100% was observed with respect to the specimen including the first interlayer 18 having the thickness D1 of 10 nm. This is because it is considered that the balance between holes and electrons of the specimen, which has been in an inappropriate state before storage at a high temperature, became close to in an appropriate state owing to storage at the high temperature.

6. Thickness of First Interlayer and Luminous Efficiency Ratio

Figure 4B:
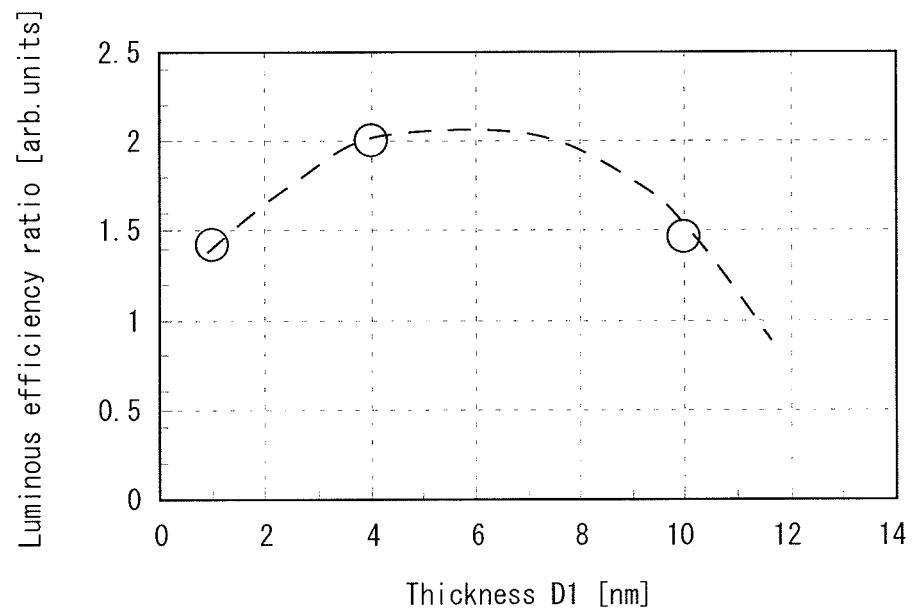
FIG. 4B is a graph showing luminous efficiency ratio that varies in accordance with variation of the thickness of the first interlayer.

FIG. 4B is a graph showing luminous efficiency ratio with respect to three specimens of the organic EL display panel 100. The three specimens differ from each other in the thickness D1 of the first interlayer 18. The respective three specimens include the first interlayer 18 having the thickness D1 of 1 nm, 4 nm, and 10 nm. Similarly to the case of the luminous efficiency ratio shown in FIG. 3, luminance was measured by applying voltage to each of the three specimens such that current density is 10 mA/cm$^2$, and luminous efficiency was calculated from the measured luminance. Then, a ratio of the calculated luminous efficiency to a reference value for luminous efficiency of the organic EL display panel (luminous efficiency ratio) was plotted on the graph.

As shown in FIG. 4B, the highest luminous efficiency ratio was observed with respect to the specimen including the first interlayer 18 having the thickness D1 of 4 nm among the three specimens. Substantially the same luminous efficiency ratio was observed with respect to the respective specimens including the first interlayer 18 having thickness D1 of 1 nm and 10 nm. From the above results, it is considered that when the thickness D1 of the first interlayer 18 is less than 1 nm and when the thickness D1 is more than 10 nm, a further low luminous efficiency ratio is observed. This is because of the following reasons. In the case where the thickness D1 of the first interlayer 18 is excessively small, an absolute amount of the first metal (Na in the present embodiment) reduces and this hinders promotion of movement of electrons from the functional layer 21 to the light-emitting layer 17. On the other hand, in the case where the thickness D1 of the first interlayer 18 is excessively large, the property of the first interlayer 18 as an insulating film increases. This degrades the luminous efficiency. Therefore, the thickness D1 of the first interlayer 18 should preferably be 1 nm to 10 nm.

7. Thickness Ratio of Second Interlayer to First Interlayer and Luminous Efficiency Ratio As described above, the thickness D1 of the first interlayer 18 needs to have the minimum value for exhibiting the property of blocking impurities. On the other hand, in the case where the thickness D1 is excessively large, the property of the first interlayer 18 as an insulating film increases. This interferes with injection of electrons to the light-emitting layer 17, and as a result sufficient luminance is not exhibited.

Also, in the case where the thickness D2 is excessively small, the second metal (Ba in the present embodiment), which is included in the second interlayer 19, cannot sufficiently liberate the first metal (Na in the present embodiment), which is included in the first interlayer 18. As a result, it is impossible to supply sufficient electrons to the light-emitting layer 17. On the other hand, in the case where the thickness D2 is excessively large, an amount of electrons, which is excessively high relative to an amount of holes supplied to the light-emitting layer 17, is supplied to the light-emitting layer 17. This degrades the luminous efficiency.

Further, in the case where the second interlayer 19 has the thickness D2 that is excessively large relative to the thickness D1 of the first interlayer 18, the second metal excessively liberates the first metal, and fluoride of the first metal (NaF in the present embodiment) reduces. As a result, the property of blocking impurities might not be sufficiently exhibited by the first interlayer 18.

Figure 5A:
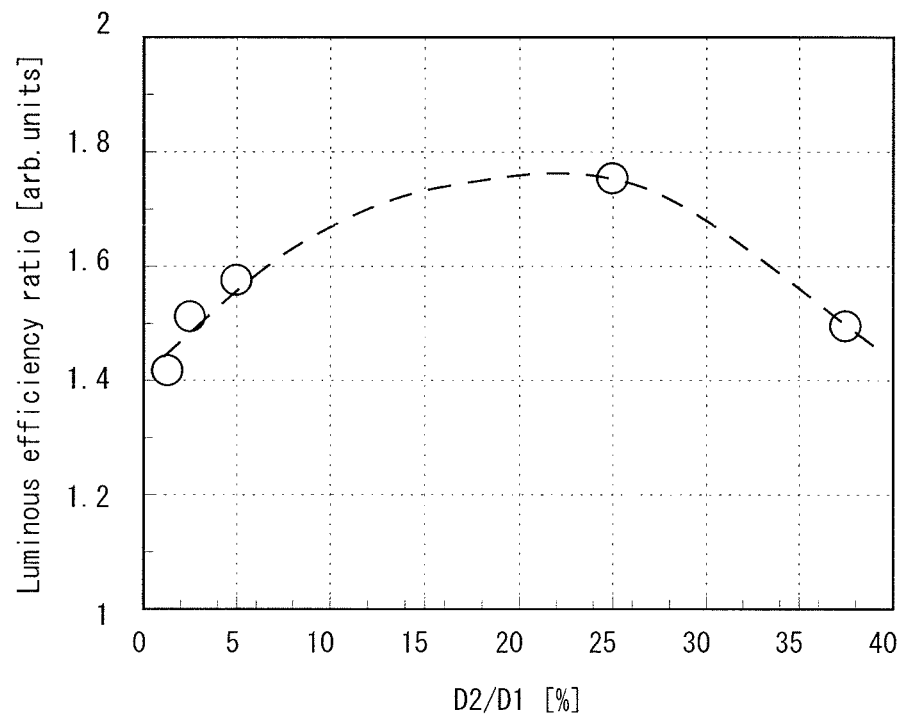
FIGS. 5A and 5B are graphs showing luminous efficiency ratio that varies in accordance with variation of ratio of the thickness of the second interlayer to the thickness of the first interlayer, with a different substance used for a hole transport layer.
Figure 5B:
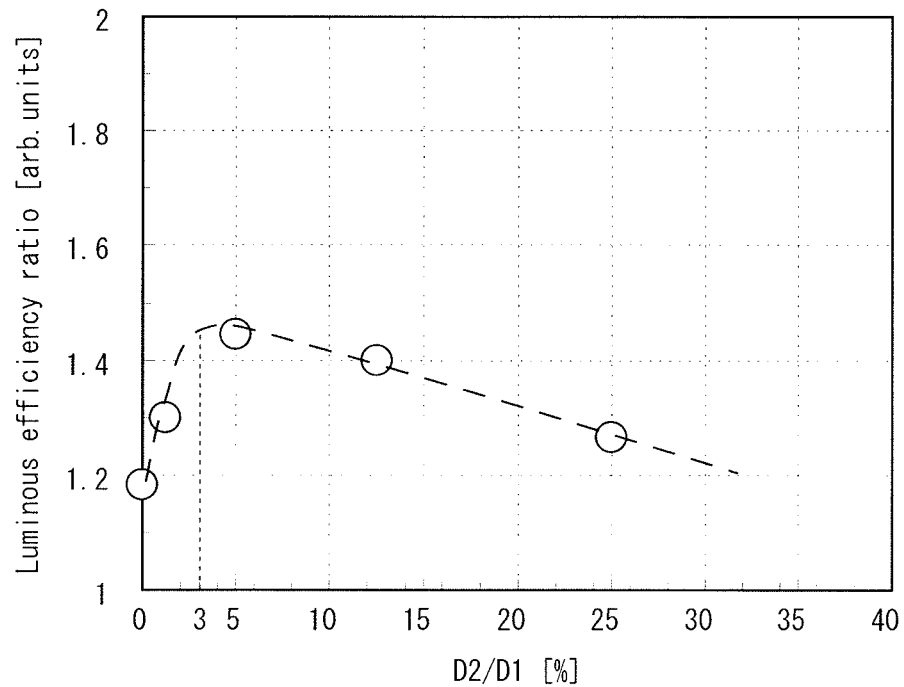

From the above results, the inventors supposed that a ratio of the thickness D2 to the thickness D1 has a preferable range, as well as the first interlayer 18 and the second interlayer 19 each have a preferable thickness range. Then, the inventors checked how the luminous efficiency ratio varies by varying the ratio of the thickness D2 to the thickness D1. FIGS. 5A and 5B show results of variation of the luminous efficiency ratio. Respective specimens shown in FIGS. 5A and 5B have basically the same structure except for the type of substance used for the hole transport layer 16. A hole transporting substance A used for the hole transport layer 16 shown in FIG. 5A has a higher hole supply property than a hole transporting substance B used for the hole transport layer 16 shown in FIG. 5B.

FIG. 5A is a graph in which the luminous efficiency ratio is plotted with respect to the respective five specimens that have the thickness ratio D2/D1 of 1.25%, 2.5%, 5%, 25%, and 37.5%. FIG. 5B is a graph in which the luminous efficiency is plotted with respect to the respective five specimens that have the thickness ratio D2/D1 of 0%, 1.25%, 5%, 12.5%, and 25%.

As shown in FIG. 5B, in the case where the hole transporting substance B, which has a comparatively low hole supply property, was used, a peak of the luminous efficiency ratio was observed when the thickness ratio D2/D1 was 3% to 5%. As shown in FIG. 5A, in the case where the hole transporting substance A, which has a comparatively high hole supply property, was used, a peak of the luminous efficiency ratio was observed when the thickness ratio D2/D1 was 20% to 25%.

The results demonstrate that when the thickness ratio D2/D1 is 3% to 25%, a preferable luminous efficiency ratio is exhibited, that is, an excellent luminous efficiency is exhibited.

As described above, there is a case where the actual boundary between the first interlayer 18 and the second interlayer 19 is not clearly defined, and material included in the first interlayer 18 and material included in the second interlayer 19 are mixed together to a certain degree during the manufacturing process thereof. In such a case, an excellent luminous efficiency is exhibited when a component ratio (mole ratio) of the second metal to the first metal in the interlayer 20 is 1% to 10%.

Figure 6:
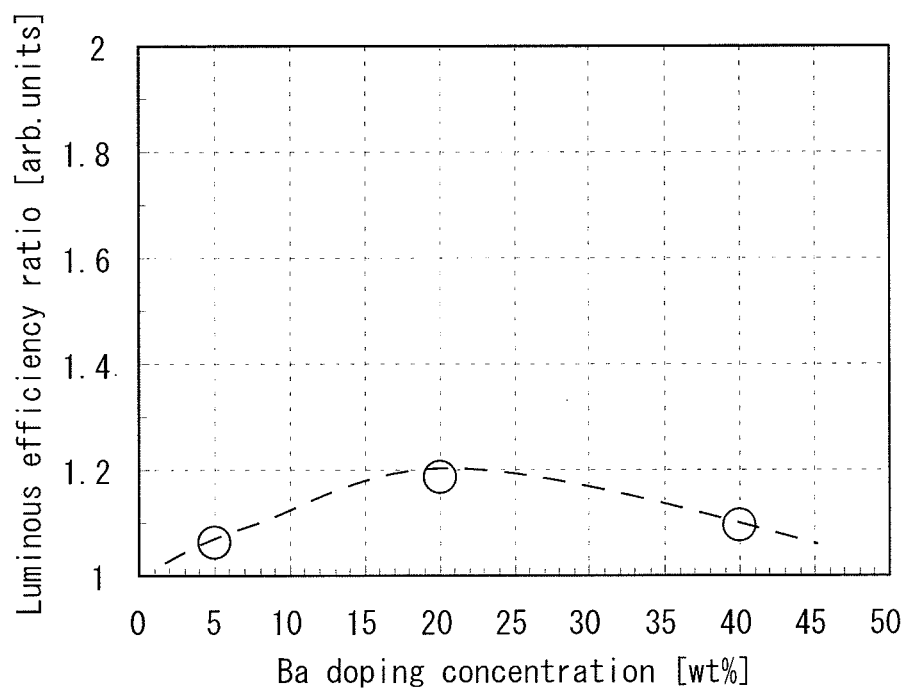
FIG. 6 is a graph showing the luminous efficiency ratio that varies in accordance with variation of concentration of a metal with which an organic material included in the functional layer is doped.

8. Concentration of Doping Metal in Electron Transport Layer and Luminous Efficiency Ratio FIG. 6 is a graph showing luminous efficiency ratio that varies in accordance with variation of concentration of a doping metal included in the functional layer 21 with respect to three specimens. Here, the three specimens were each doped with barium (Ba). The respective three specimens have the concentration of the doping metal of 5 wt %, 20 wt %, and 40 wt %. The specimens each include the first interlayer 18 having the thickness D1 of 4 nm and the second interlayer 19 having the thickness D2 of 0.2 nm.

As shown in FIG. 6, the highest luminous efficiency ratio was observed with respect to the specimen including the functional layer 21 having the concentration of the doping metal of 20 wt % among the three specimens. Also, a luminous efficiency ratio of 1 or higher was observed with respect to each of the three specimens, and was more excellent than the reference value for luminous efficiency. This demonstrates that excellent luminous efficiency is exhibited when the functional layer 21 has the concentration of the doping metal of 5 wt % to 40 wt %.

9. Manufacturing Method of Organic EL Element

Figure 9A:
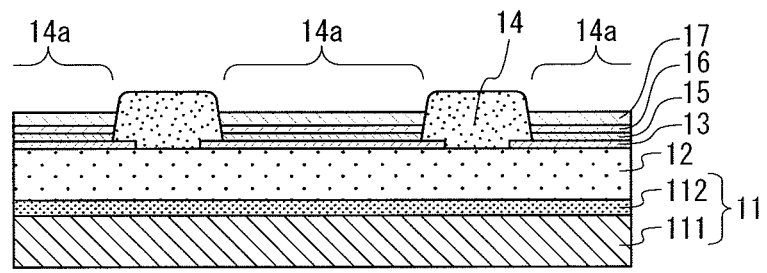
FIGS. 9A-9C are partial cross-sectional views schematically showing the manufacturing process of the organic EL element, continuing from FIG. 8C, where
Figure 9B:
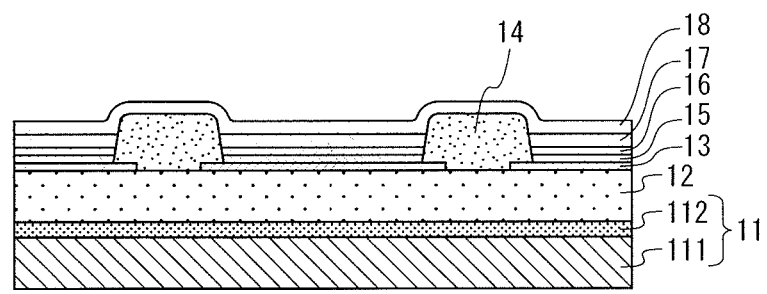
Figure 9C:
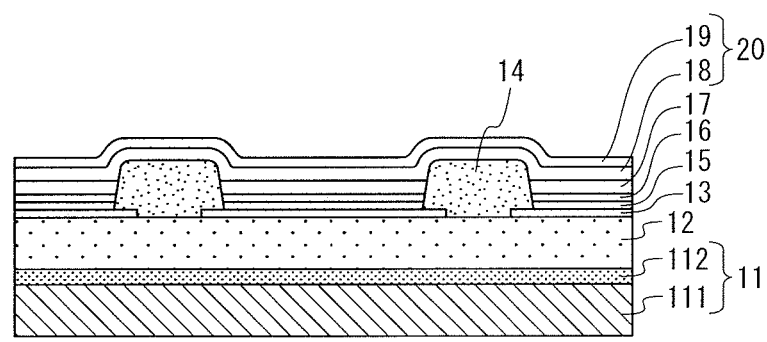
Figure 10A:
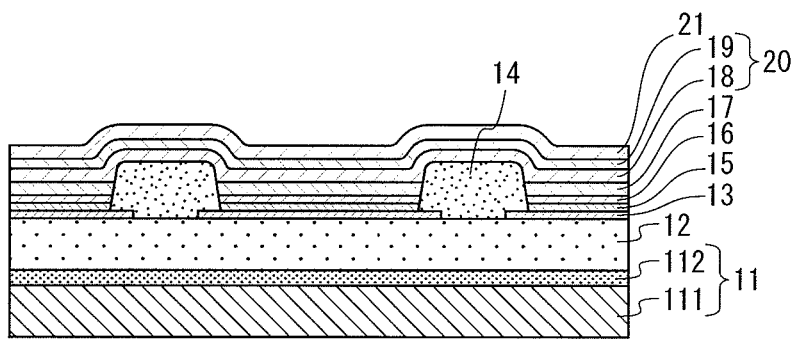
FIGS. 10A-10C are partial cross-sectional views schematically showing the manufacturing process of the organic EL element, continuing from FIG. 9C, where
Figure 10B:
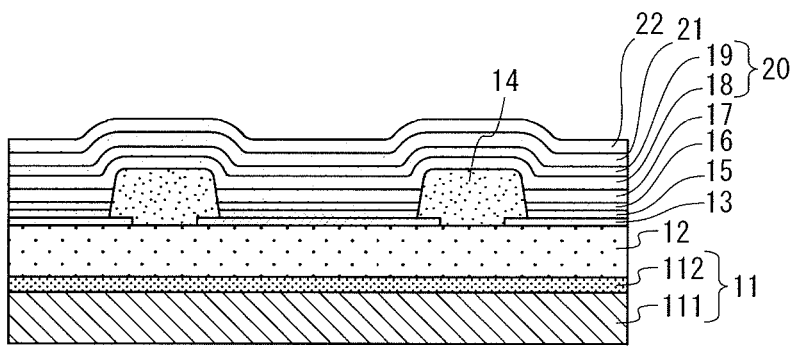
Figure 10C:
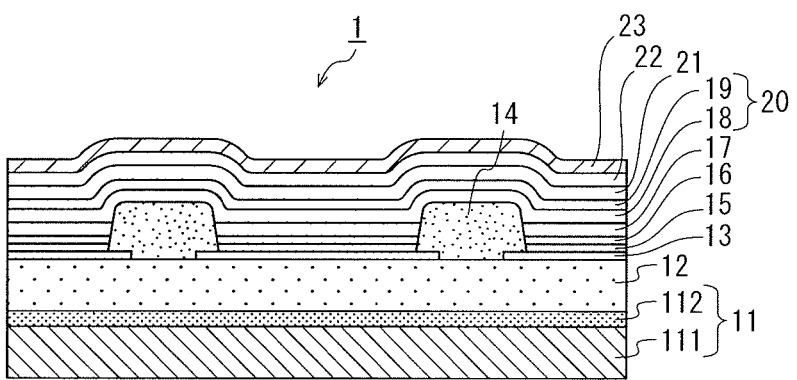
Figure 11:
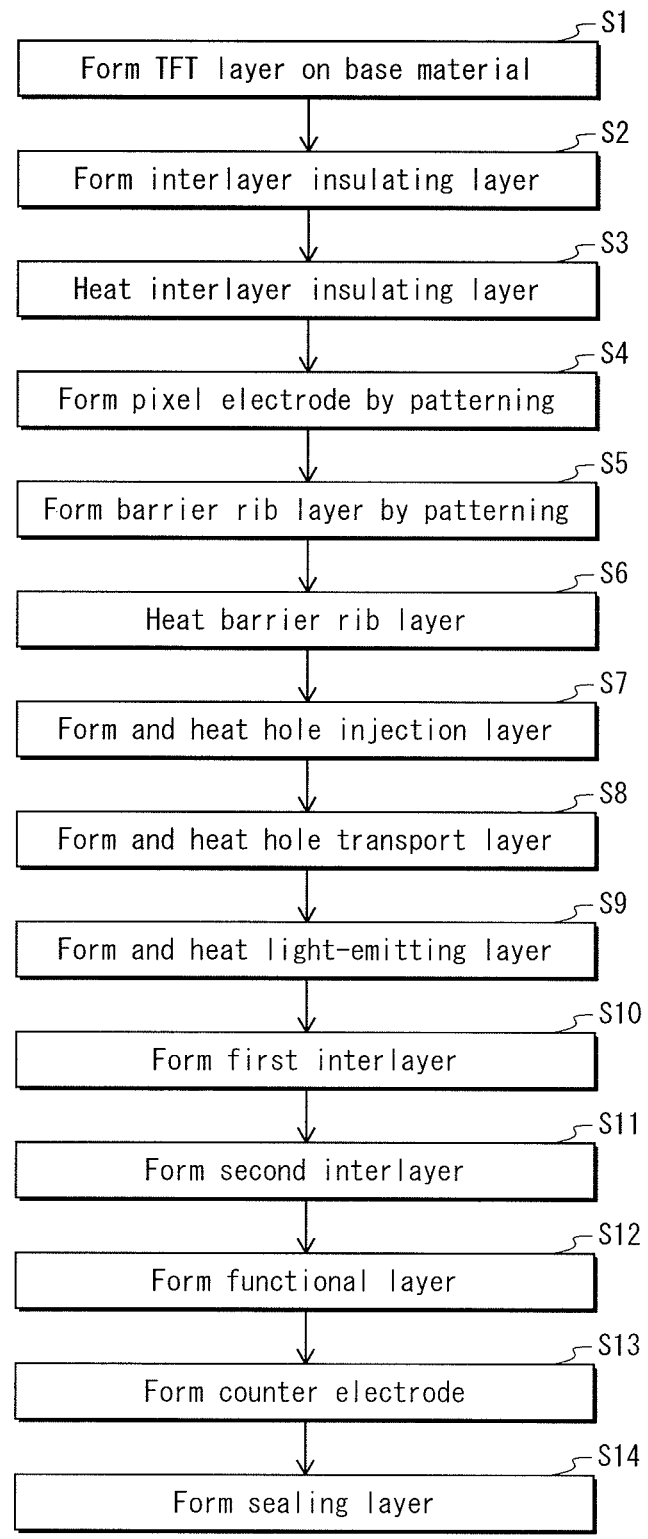
FIG. 11 is a flow chart schematically showing the manufacturing process of the organic EL element relating to the embodiment of the present disclosure.

The following explains a manufacturing method of the organic EL element 1 relating to the present embodiment, with reference to FIGS. 7A-10C and 11. FIGS. 7A-10C are cross-sectional views schematically showing a manufacturing process of the organic EL element 1, and FIG. 11 is a flow chart schematically showing the manufacturing process of the organic EL element 1.

Figure 7A:
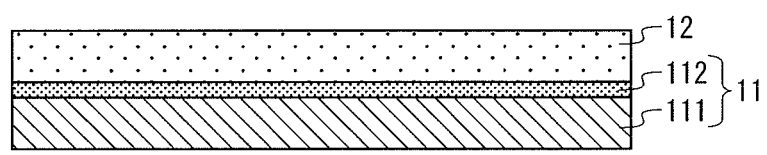
FIGS. 7A-7C are partial cross-sectional views schematically showing a manufacturing process of the organic EL element relating to the embodiment of the present disclosure, where

As shown in FIG. 7A, a substrate 11 is formed by forming a TFT layer 112 on a base material 111 (Step S1 in FIG. 11), and an interlayer insulating layer 12 is formed on the substrate 11 (Step S2 in FIG. 11). In the present embodiment, as a resin for an interlayer insulating layer that is a material of the interlayer insulating layer 12, acrylic resin, which is a positive photosensitive material, is used. The interlayer insulating layer 12 is formed by applying solution for the interlayer insulating layer onto the substrate 11, and heating the solution (Step S3 in FIG. 11). The solution for the interlayer insulating layer is solution in which acrylic resin, which is resin for interlayer insulating layer, is dissolved in solvent for the interlayer insulating layer such as propyleneglycol monomethylether acetate (PGMEA). Heating of the solution is performed for example at a temperature of 150 degrees C. to 210 degrees C. for 180 minutes.

Although not shown in the cross-sectional views in FIGS. 7A-10C and the flow chart in FIG. 11, while the interlayer insulating layer 12 is formed, a contact hole is formed at a position between each two openings 14a of the interlayer insulating layer 12 (each two adjacent regions where the openings 14a are to be formed). The contact hole is formed by performing pattern exposure and developing. Since the interlayer insulating layer 12 becomes solid after heating, the contact hole is formed more easily before heating the interlayer insulating layer 12 than after heating the interlayer insulating layer 12.

Figure 7B:
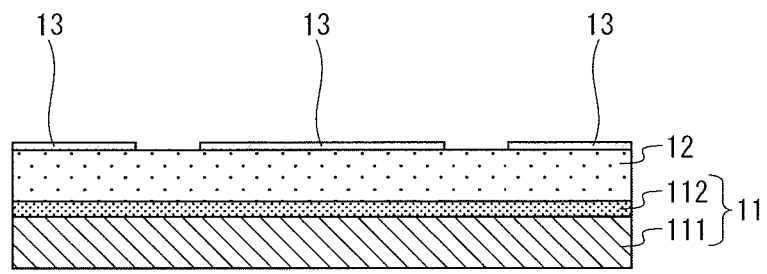

Then, as shown in FIG. 7B, a pixel electrode 13 is formed for each subpixel by forming a film having a thickness of approximate 150 nm from a metal material using a vacuum deposition method or a sputtering method (Step S4 in FIG. 11).

Figure 7C:
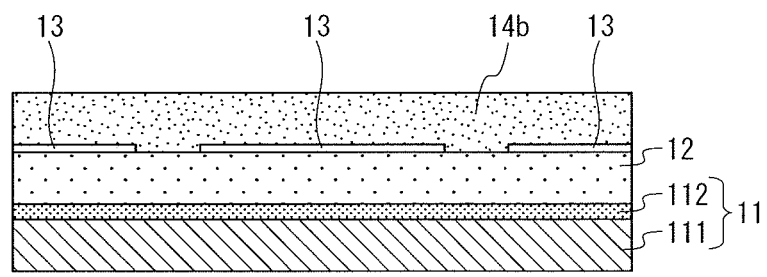

Next, a barrier rib material layer 14b is formed by applying a resin for a barrier rib layer that is a material of a barrier rib layer 14 onto the pixel electrode 13 and the interlayer insulating layer 12 (FIG. 7C). As the resin for the barrier rib layer, phenol resin, which is a positive photosensitive material, is for example used. The barrier rib material layer 14b is formed for example by uniformly applying, onto the pixel electrode 13 and the interlayer insulating layer 12, solution in which phenol resin, which is the resin for the barrier rib layer is dissolved in solvent (such as mixed solvent of ethyl lactate and gamma-butyrolactone (GBL)), with use of a spin coat method or the like.

Next, the barrier rib layer 14 is formed by performing pattern exposure and developing on the barrier rib material layer 14b (FIG. 8A and Step S5 in FIG. 11), and the barrier rib layer 14 is heated (Step S6 in FIG. 11). The barrier rib layer 14 defines the opening 14a that is a region in which a light-emitting layer 17 is to be formed. Heating of the barrier rib layer 14 is performed for example at a temperature of 150 degrees C. to 210 degrees C. for 60 minutes.

In a process of forming the barrier rib layer 14, a surface of the barrier rib layer 14 may undergo surface processing with use of predetermined alkaline solution, water, organic solvent, or the like, or plasma processing. Surface processing of the barrier rib layer 14 is performed in order to adjust a contact angle of the barrier rib layer 14 relative to ink (solution) to be applied to the opening 14a or to provide the surface of the barrier rib layer 14 with repellency.

Figure 8A:
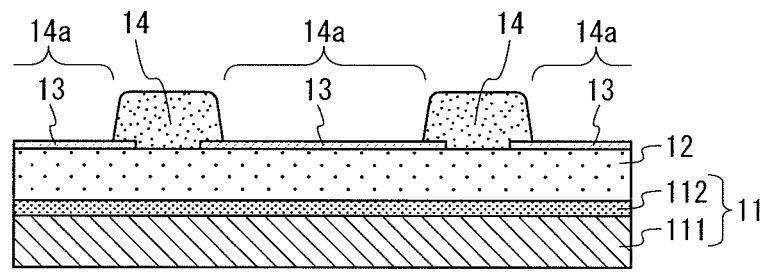
FIGS. 8A-8C are partial cross-sectional views schematically showing the manufacturing process of the organic EL element, continuing from FIG. 7C, where
Figure 8B:
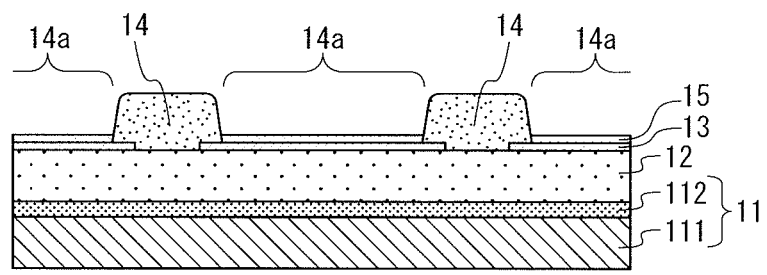

Then, as shown in FIG. 8B, a hole injection layer 15 is formed by forming a film from a material of the hole injection layer 15 within the opening 14a using an applying method such as a mask vapor deposition method and an inkjet method, and the hole injection layer 15 is heated (Step S7 in FIG. 11).

Figure 8C:
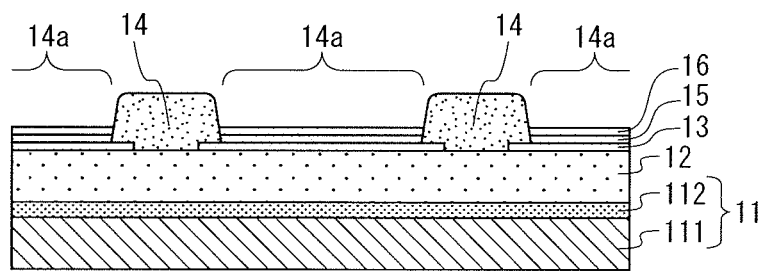

Next, as shown in FIG. 8C, a hole transport layer 16 is formed by applying ink including a material of the hole transport layer 16 to the opening 14a defined by the barrier rib layer 14, and heating (and drying) the ink (Step S8 in FIG. 11).

Similarly, as shown in FIG. 9A, the light-emitting layer 17 is formed within the opening 14a by applying ink including a material of the light-emitting layer 17, and heating (and drying) the ink (Step S9 in FIG. 11).

Then, as shown in FIG. 9B, a first interlayer 18 having a thickness D1 is formed on the light-emitting layer 17 and the barrier rib layer 14 using the vacuum deposition method or the like (Step S10 in FIG. 11).

Then, as shown in FIG. 9C, a second interlayer 19 having a thickness D2 is formed on the first interlayer 18 using the vacuum deposition method or the like (Step S11 in FIG. 11). The first interlayer 18 and the second interlayer 19 constitute the interlayer 20.

Next, as shown in FIG. 10A, a functional layer 21 is formed on the second interlayer 19 by forming a film from a material of the functional layer 21 using the vacuum deposition method (Step S12 in FIG. 11).

Next, as shown in FIG. 10B, a counter electrode 22 is formed on the functional layer 21 by forming a film from a material such as ITO and IZO using the vacuum deposition method, the sputtering method, or the like (Step S13 in FIG. 11).

Then, as shown in FIG. 10C, a sealing layer 23 is formed on the counter electrode 22 by forming a film from a light-transmissive material such as SiN and SiON using the sputtering method, a CVD method, or the like (Step S14 in FIG. 11).

Through the above processes, an organic EL element 1 is complete, and an organic EL display panel 100 including a plurality of organic EL elements 1 is also complete. Note that a color filter, an upper substrate, and so on may be adhered onto the sealing layer 23.

10. Overall Structure of Organic EL Display Device

Figure 12:
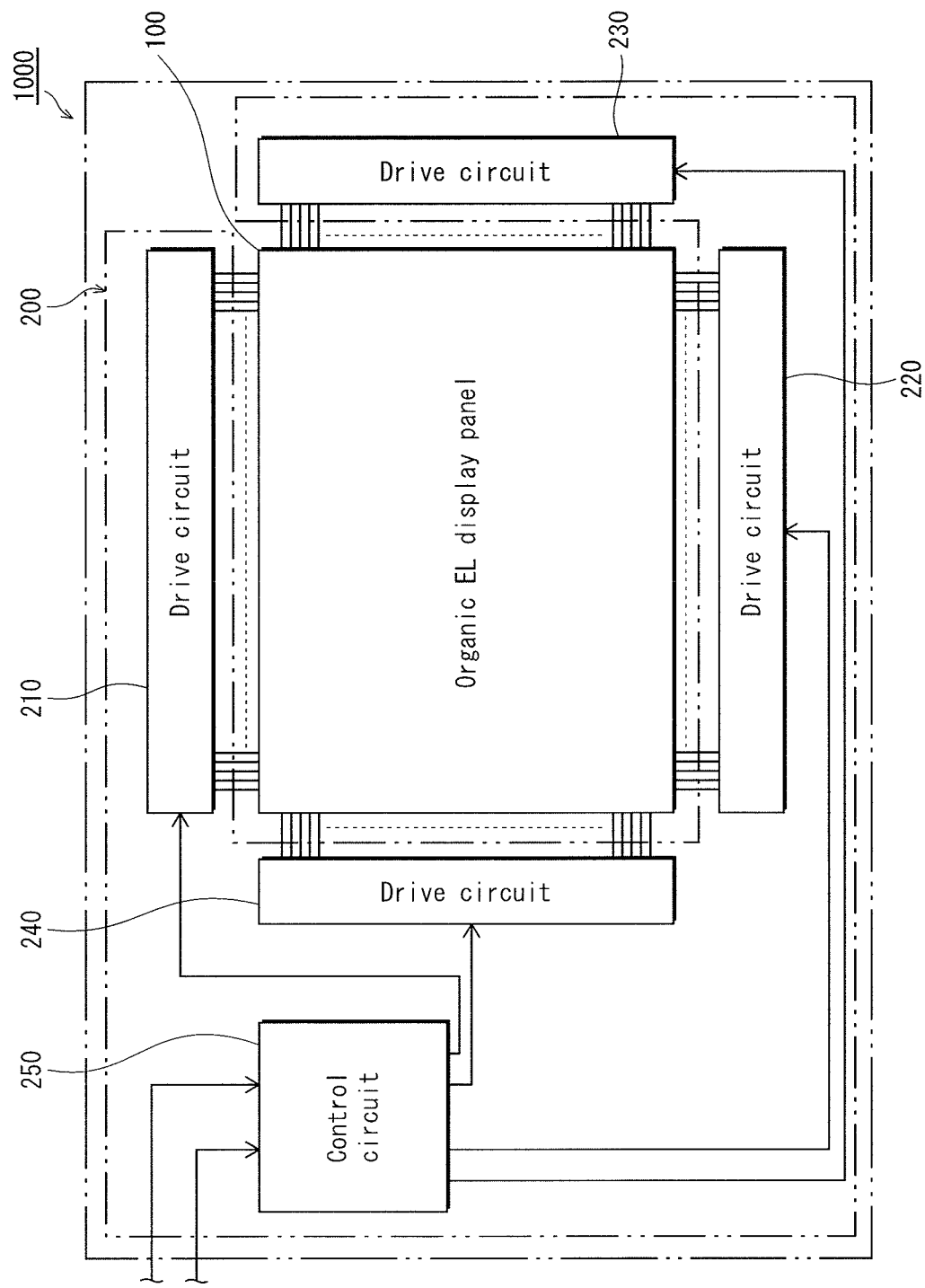
FIG. 12 is a block diagram schematically showing a structure of an organic EL display device including the organic EL element relating to the embodiment of the present disclosure.

FIG. 12 is a block diagram schematically showing an organic EL display device 1000 including the organic EL display panel 100 having the organic EL elements 1. As shown in FIG. 12, the organic EL display device 1000 includes the organic EL display panel 100 and a drive control unit 200 that is connected to the organic EL display panel 100. The organic EL display panel 100 is a display panel employing electroluminescence phenomenon of organic materials, and has the organic EL elements 1 that are arranged for example in matrix. The drive control unit 200 includes four drive circuits 210 to 240 and a control circuit 250.

In the actual organic EL display device 1000, the drive control unit 200 is not limited to this arrangement relative to the organic EL display panel 100.

[Summary of Embodiment]

According to the organic EL element 1 relating to the present embodiment of the present disclosure, as described above, the first interlayer 18 prevents intrusion of impurities from the light-emitting layer 17 into the functional layer 21 and the counter electrode 22. In addition, the second interlayer 19 promotes electron injection from the counter electrode 22 to the light-emitting layer 17. This exhibits excellent storage stability and luminous property.

Further, the thickness D1 of the first interlayer 18 and the thickness D2 of the second interlayer 19 satisfy 3%≤D2/D1≤25%. This exhibits an excellent luminous efficiency.

Moreover, since the thickness D2 of the second interlayer 19 is 1 nm or less, a low amount of light absorbed by the second interlayer 19 is achieved and an excellent light extraction efficiency is exhibited even in the organic EL display panel which is of the top-emission type.

Note that the conditions for the values and the ratio of the thickness in the above explanation do not necessarily need to be satisfied with respect to the whole region of each subpixel defined by the opening 14a. The conditions for the values and the ratio of the thickness only need to be satisfied with respect to the center part of the subpixel in plan view. The conditions for the values and the ratio of the thickness may not be satisfied with respect to part of the region of the subpixel (for example, a region adjacent to the barrier rib layer 14, or a region formed partially on the barrier rib layer 14).

MODIFICATIONS

Although the explanation has been given on the present disclosure based on the embodiment, the present disclosure is not limited to the embodiment. The following modifications for example may be made.

(Modification 1) In the above embodiment, the explanation has been given on the example in which the organic EL element 1 includes the hole injection layer 15, the hole transport layer 16, and the functional layer 21. However, the present disclosure is not limited to this. Alternatively, the organic EL element 1 may not include at least one or all of these layers.

(Modification 2) Further, the organic EL element relating to the present disclosure may further include other layer such as an electron injection layer and a transparent conductive layer. In the case where the organic EL element includes the electron injection layer, the electron injection layer and the electron transport layer may be collected as the functional layer. Also, in the case where the organic EL element does not include the electron transport layer and includes the electron injection layer, the electron injection layer may be dealt as the functional layer.

(Modification 3) In the above embodiment, the explanation has been given on the example in which glass is used as the insulating material of the base material 111 included in the organic EL element 1. However, the present disclosure is not limited to this structure. Alternatively, resin, ceramic, or the like may be used as the insulating material of the base material 111. Examples of the resin used for the base material 111 include polyimide resin, acrylic resin, styrene resin, polycarbonate resin, epoxy resin, polyethersulfone, polyethylene, polyester, and silicone resin. Examples of ceramic used for the base material 111 include aluminum.

(Modification 4) In the above embodiment, the pixel electrode 13 is an anode and the counter electrode 22 is a cathode. However, the present disclosure is not limited to this structure. Alternatively, the pixel electrode 13 may be a cathode and the counter electrode 22 may be an anode. In this case, the pixel electrode 13 as the cathode and the barrier rib layer 14 are provided on the interlayer insulating layer 12. Further, the functional layer 21, the second interlayer 19, the first interlayer 18, and the light-emitting layer 17 are provided on the pixel electrode 13 within the opening 14a in respective order. Then, the hole transport layer 16 and the hole injection layer 15 are provided on the light-emitting layer 17 in respective order. Further, the counter electrode 22 as the anode is provided on the hole injection layer 15.

Moreover, in the case where an organic EL display panel relating to the present modification is of the top-emission type, the counter electrode 22 as the anode is made of a light-transmissive conductive material such as ITO and IZO. The pixel electrode 13 as the cathode should be made of a light-reflective conductive material such as Ag, Al, Al alloy, Mo, APC, ARA, MoCr, MoW, and NiCr.

Further, in the case where the organic EL display panel relating to the present modification is of the bottom-emission type, contrary to the above, the counter electrode 22 as the anode should be made of a light-reflective conductive material, and the pixel electrode 13 as the cathode should be made of a light-transmissive conductive material.

INDUSTRIAL APPLICABILITY

The organic EL element, a manufacturing method of the organic EL element, and so on relating to the present disclosure are preferably utilizable for an organic EL element used as displays in various types of display devices for households, public facilities, and business, displays for television devices, portable electronic devices, and so on.

REFERENCE SIGNS LIST

1 organic EL element
13 pixel electrode (anode)
17 light-emitting layer
18 first interlayer
19 second interlayer
20 interlayer
21 functional layer (electron transport layer)
22 counter electrode (cathode)

The invention claimed is:

1. An organic EL element, comprising:
a substrate;
an interlayer insulating layer formed on the substrate;
an anode formed on a part of the interlayer insulating layer;
a barrier rib layer formed on the interlayer insulating layer where the anode is not formed;
a light-emitting layer that is disposed above the anode;
a first interlayer that is disposed on the light-emitting layer, and includes a fluorine compound including a first metal that is an alkali metal or an alkaline-earth metal;
a second interlayer that is disposed on the first interlayer, and includes a second metal that has a property of cleaving a bond between the first metal and fluorine in the fluorine compound;
a functional layer that is disposed on the second interlayer, and has at least one of an electron transport property and an electron injection property; and
a cathode that is disposed above the functional layer,
wherein the barrier rib layer is formed on the anode so as to expose a partial region of an upper surface of the anode and cover a peripheral region of the partial region of the upper surface of the anode,
wherein a thickness D1 of the first interlayer is 4 nm or more, and
wherein the thickness D1 of the first interlayer and a thickness D2 of the second interlayer satisfy $3\% \leq D2/D1 \leq 25\%$.

2. The organic EL element of claim 1,
wherein the second metal is an alkali metal or an alkaline-earth metal.

3. The organic EL element of claim 1,
wherein the thickness D2 is 0.1 nm to 1 nm.

4. The organic EL element of claim 1,
wherein the functional layer is made of an organic material that is doped with an alkali metal or an alkaline-earth metal.

5. The organic EL element of claim 4,
wherein a concentration of the alkali metal or the alkaline-earth metal in the organic material is 5 wt % to 40 wt %.

6. The organic EL element of claim 4,
wherein the alkali metal or the alkaline-earth metal with which the organic material is doped is the same as the second metal.

7. The organic EL element of claim 6,
wherein the alkali metal or the alkaline-earth metal with which the organic material is doped and the second metal are each barium.

8. The organic EL element of claim 1,
wherein the first metal is sodium.

9. A manufacturing method of an organic EL element, comprising:
forming a substrate;
forming an interlayer insulating layer on the substrate;
forming an anode on a part of the interlayer insulating layer;
forming a barrier rib layer on the interlayer insulating layer where the anode is not formed;
forming, above the anode, a light-emitting layer;
forming, on the light-emitting layer, a first interlayer that has a thickness D1, and includes a fluorine compound including a first metal that is an alkali metal or an alkaline-earth metal;
forming, on the first interlayer, a second interlayer that has a thickness D2, and includes a second metal that has a property of cleaving a bond between the first metal and fluorine in the fluorine compound;
forming, on the second interlayer, a functional layer that has at least one of an electron transport property and an electron injection property; and
forming, above the functional layer, a cathode,
wherein the barrier rib layer is formed on the anode so as to expose a partial region of an upper surface of the anode and cover a peripheral region of the partial region of the upper surface of the anode,
wherein the thickness D1 of the first interlayer is 4 nm or more, and
wherein the thickness D1 and the thickness D2 satisfy $3\% \leq D2/D1 \leq 25\%$.

10. The manufacturing method of claim 9,
wherein the second metal is an alkali metal or an alkaline-earth metal.

11. The manufacturing method of claim 9,
wherein the thickness D2 is 0.1 nm to 1 nm.

12. The manufacturing method of claim 9,
wherein the functional layer is formed by doping an organic material with an alkali metal or an alkaline-earth metal.

13. The manufacturing method of claim 12,
wherein a concentration of the alkali metal or the alkaline-earth metal in the organic material is 5 wt % to 40 wt %.

14. The manufacturing method of claim 12,
wherein the alkali metal or the alkaline-earth metal with which the organic material is doped is the same as the second metal.

15. The manufacturing method of claim 14,
wherein the alkali metal or the alkaline-earth metal with which the organic material is doped and the second metal are each barium.

16. The manufacturing method of claim 9,
wherein the first metal is sodium.

17. An organic EL element, comprising:
a substrate;
an interlayer insulating layer formed on the substrate;
an anode formed on a part of the interlayer insulating layer;
a barrier rib layer formed on the interlayer insulating layer where the anode is not formed;
a light-emitting layer that is disposed above the anode;
an interlayer that is disposed on the light-emitting layer;
a functional layer that is disposed on the interlayer, and has at least one of an electron transport property and an electron injection property; and
a cathode that is disposed above the functional layer,
wherein the barrier rib layer is formed on the anode so as to expose a partial region of an upper surface of the anode and cover a peripheral region of the partial region of the upper surface of the anode,
wherein the interlayer includes
a fluorine compound including a first metal that is an alkali metal or an alkaline-earth metal and a second metal that has a property of cleaving a bond between the first metal and fluorine in the fluorine compound,
wherein a concentration of the first metal in the interlayer increases as approaching the light-emitting layer from the functional layer, wherein a concentration of the second metal in the interlayer increases as approaching the functional layer from the light-emitting layer, wherein the interlayer includes a first interlayer a having a thickness D1 of 4 nm or more and a second interlayer, and wherein the thickness D1 of the first interlayer and a thickness D2 of the second interlayer satisfy $3\% \leq D2/D1 \leq 25\%$.

18. The organic EL element of claim 17,
wherein the second metal is an alkali metal or an alkaline-earth metal.

19. The organic EL element of claim 17,
wherein the functional layer includes an organic material that is doped with an alkali metal or an alkaline-earth metal.

20. The organic EL element of claim 19,
wherein a concentration of the alkali metal or the alkaline-earth metal in the organic material is 5 wt % to 40 wt %.

21. The organic EL element of claim 19,
wherein the alkali metal or the alkaline-earth metal with which the organic material is doped is the same as the second metal.

22. The organic EL element of claim 21,
wherein the alkali metal or the alkaline-earth metal with which the organic material is doped and the second metal are each barium.

23. The organic EL element of claim 17,
wherein the first metal is sodium.

* * * * *